United States Patent [19]
Lin

[11] Patent Number: 6,093,632
[45] Date of Patent: Jul. 25, 2000

[54] MODIFIED DUAL DAMASCENE PROCESS

[75] Inventor: Kang-Cheng Lin, Taipei, Taiwan

[73] Assignee: Industrial Technology Research Institute, Hsin-Chu, Taiwan

[21] Appl. No.: 09/206,738

[22] Filed: Dec. 7, 1998

[51] Int. Cl.[7] .................... H01L 21/4763; H01L 21/311
[52] U.S. Cl. .................... 438/618; 438/622; 438/640; 438/700
[58] Field of Search ..................... 438/618, 637, 438/700, 626, 624, 701, 702, 640, 667, 622

[56] References Cited

U.S. PATENT DOCUMENTS

| | | | |
|---|---|---|---|
| 5,612,254 | 3/1997 | Mu et al. | 437/195 |
| 5,635,423 | 6/1997 | Huang et al. | 437/195 |
| 5,686,354 | 11/1997 | Avanzino et al. | 437/190 |
| 5,723,387 | 3/1998 | Chen | 438/692 |
| 5,739,579 | 4/1998 | Chiang et al. | 257/635 |
| 5,753,967 | 5/1998 | Lin | 257/635 |
| 5,935,762 | 8/1999 | Dai et al. | 438/724 |
| 5,989,997 | 11/1999 | Lin et al. | 438/622 |
| 6,001,414 | 12/1999 | Huang et al. | 427/96 |
| 6,001,733 | 12/1999 | Huang et al. | 438/633 |
| 6,025,226 | 2/2000 | Gambino et al. | 438/244 |
| 6,027,994 | 2/2000 | Huang et al. | 438/618 |
| 6,028,362 | 2/2000 | Omura | 257/774 |
| 6,033,977 | 3/2000 | Gutsche et al. | 438/618 |

*Primary Examiner*—Son T. Dinh
*Assistant Examiner*—Michael S. Lebentritt
*Attorney, Agent, or Firm*—George O. Saile; Stephen B. Ackerman

[57] ABSTRACT

A process for creating a metal filled, dual damascene opening, in a composite insulator layer, has been developed. The process features selective RIE procedures, used to create a wide diameter opening in an upper silicon oxide layer, and a narrow diameter opening in a lower silicon oxide layer. Small area, silicon nitride islands, or shapes, a component of the composite insulator layer, are used as a stop layer, during the selective RIE procedures. The use of small area, silicon nitride shapes, offers less composite insulator capacitance, than counterparts fabricated using larger area, silicon nitride stop layers.

24 Claims, 4 Drawing Sheets

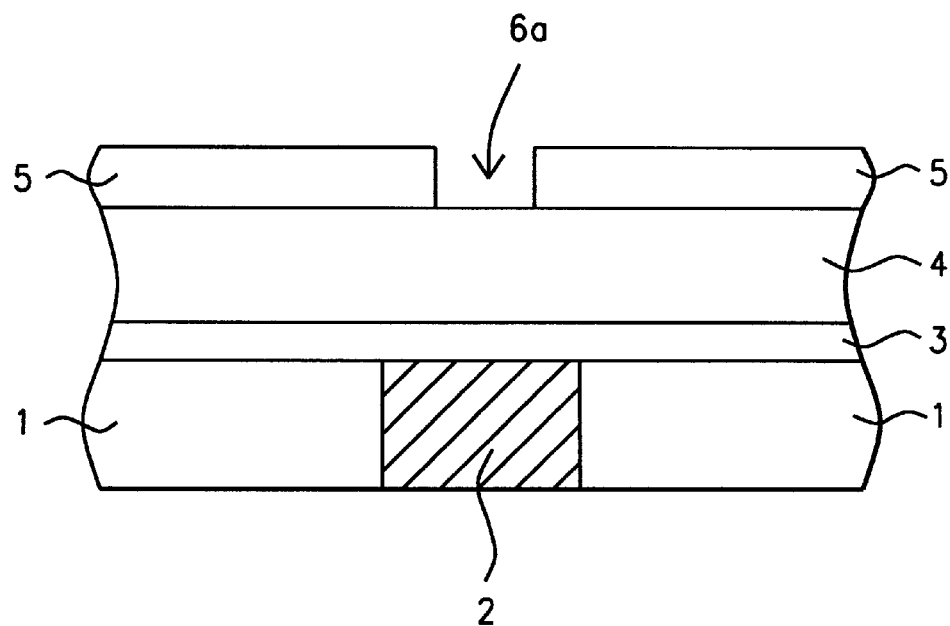
FIG. 1 – Prior Art
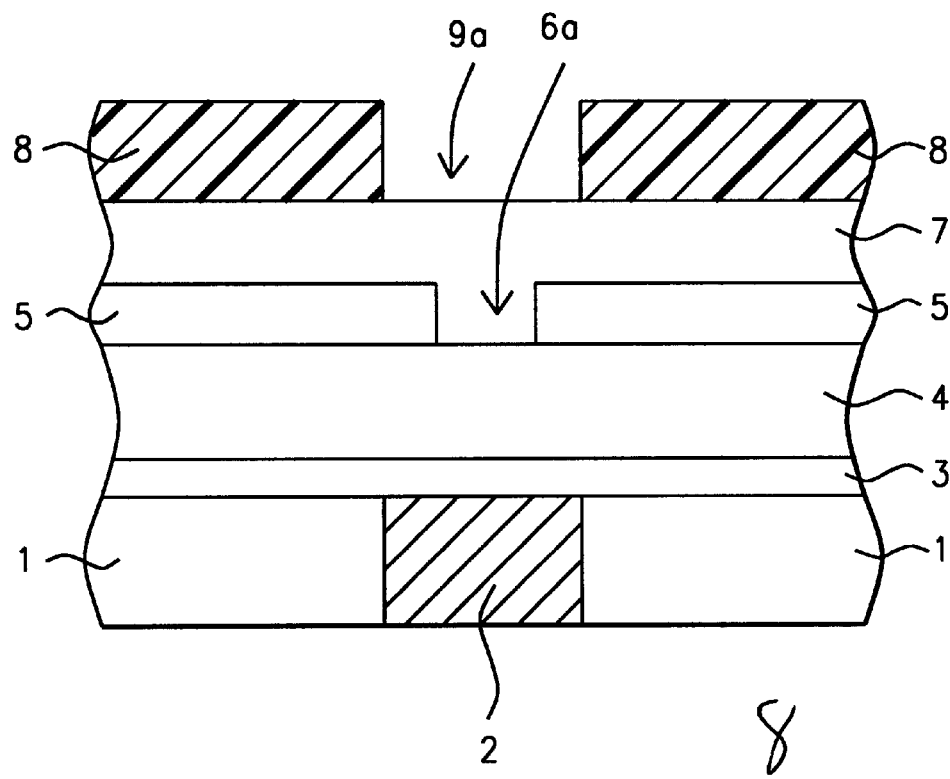
FIG. 2 – Prior Art

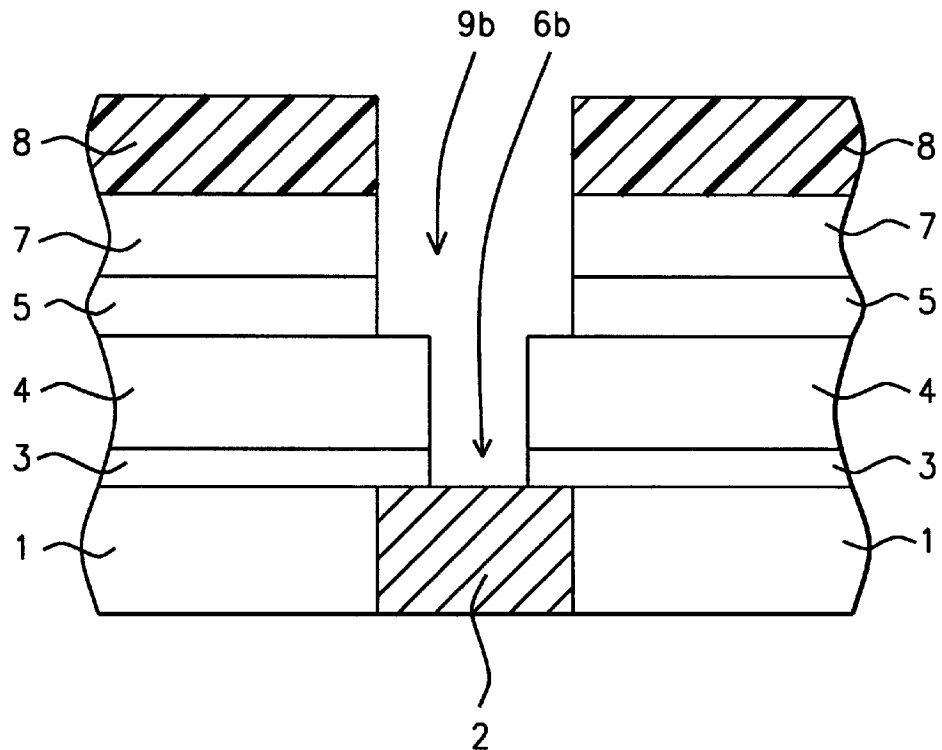
FIG. 3 - Prior Art
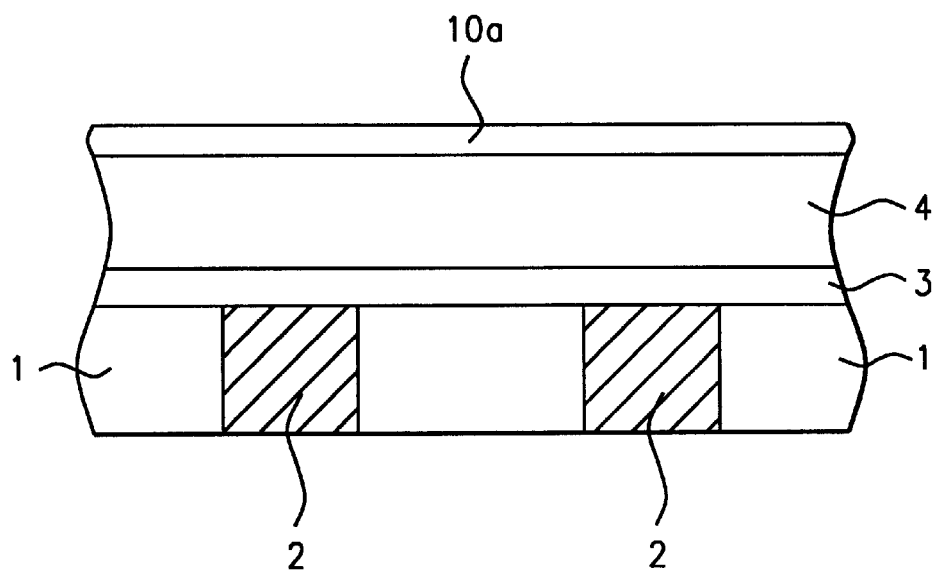
FIG. 4

MODIFIED DUAL DAMASCENE PROCESS

BACKGROUND OF THE INVENTION (1) Field of the Invention

The present invention relates to processes used to fabricate semiconductor devices, and more specifically to a method used to create conductive vias and conductive interconnect structures, using a damascene patterning process.

(2) Description of the Prior Art

The use of sub-micron features, or micro-miniaturization, has allowed the semiconductor industry to increase device density for very large scale integrated, (VLSI), semiconductor chips. The evolution to micro-miniaturization has been highlighted by advances in specific semiconductor fabrication disciplines such as photolithography, and dry etching. The development of mode sophisticated exposure cameras, as well as the use of more photo-sensitive materials, have allowed sub-micron images, in photoresist layers, to be routinely obtained. In addition the advent of advanced dry etching tools, and processes, have in turn allowed the sub-micron images, in masking photoresist layers, to be successfully transferred to underlying materials, used in the fabrication of VLSI chips. However to continue to decrease the size of semiconductor chips, specific process or structural innovations, are also needed, in addition to the advances in specific semiconductor fabrication disciplines. One such process innovation has been the use of dual damascene patterning, for attainment of metal lines and metal vias. The dual damascene procedure features the creation of a pattern, opened in an insulator layer, with the dual damascene pattern comprised of an underlying narrow diameter opening, and a wider diameter, overlying opening. Filling of the dual damascene opening, in the insulator layer, with metal, results a metal structure comprised of a metal interconnect structure, located in the wider diameter opening, overlying a metal via, located in the narrower diameter opening, in the dual damascene opening. The dual damascene procedure, in which both metal interconnects, and metal vias, are formed using a single metal fill, and only one metal patterning, or removal procedure, offers advantages over conventional procedures, in which a metal fill, and a metal patterning procedure, would have to be used for both the metal via structure, and the metal interconnect structure.

A critical step, used for creation of a dual damascene opening, is the ability to form, or to terminate, the wider diameter opening, in a top portion of an insulator layer, without transferring this wider diameter opening, to the bottom portion of the insulator layer, where the narrow diameter opening is to be formed. One method used to address this concern is the use of a stop layer, placed between both portions of the insulator layer. After forming the desired narrow diameter openings, in the stop layer, which resides on the unetched lower portion of insulator layer, the top portion of insulator layer is deposited. A photoresist shape, featuring the wider diameter opening, is used as a mask to create the wider diameter opening, in the top portion of the insulator layer, exposing the stop layer, which is comprised of narrow diameter openings. A selective dry etch procedure, is then use to form the narrow diameter openings, in the bottom portion of the insulator layer, exposed in the narrow diameter openings, in the stop layer. However to successfully prevent unwanted etching of the bottom portion of insulator layer, a thick stop layer, exhibiting a low removal rate in the dry etching process used for insulator etching, is employed. Therefore if silicon oxide, with a dielectric constant of only about 3.9 is used, as the insulator layer, minimizing performance degrading capacitances, the stop layer used is usually comprised of silicon nitride, allowing the desired dry etching selectivity to be realized. However since a continuous, except for the narrow diameter openings, silicon nitride, stop layer, with a dielectric constant of about 7, is needed, performance concerns exist.

This invention will describe a dual damascene patterning procedure, used to create metal vias and interconnects, in openings formed in a composite insulator layer, and featuring the use of a silicon nitride stop layer, strategically placed between silicon oxide layers, of the composite insulator layer. However this invention will describe a novel patterning sequence, featuring the use of small area, silicon nitride islands, used for the needed stop layer, thus resulting in a less capacitance increase, than counterparts fabricated using larger area, silicon nitride stop layers. Prior art, such as Avanzino et al, in U.S. Pat. No. 5,686,354, as well as Huang et al, in U.S. Pat. No. 5,635,423, describe dual damascene processes, however these prior art do not show the stop layer, comprised of small area, silicon nitride islands, used in the present invention, offering less capacitance than counterparts described in the prior art.

SUMMARY OF THE INVENTION

It is an object of this invention to fabricate metal interconnect structures, and underlying metal via structures, using a dual damascene process.

It is another object of this invention to use silicon nitride as a stop layer, in a composite insulator layer, placed between an upper layer of silicon oxide and a lower layer of silicon oxide, and used to protect the lower layer of silicon oxide from the dry etching procedure used to create the wide diameter opening, in the upper layer of silicon oxide.

It is yet another object of this invention to use small area silicon nitride islands or shapes, as the stop layer, to limit the capacitance increase, introduced by the silicon nitride layer.

In accordance with the present invention a dual damascene patterning process, used for creation of a metal structure comprised of an overlying, wide, metal interconnect, and an underlying, narrow, metal via structure, is described, featuring small islands of silicon nitride, used as an etch stop layer, during the dry etching procedure used to create wide and narrow diameter openings, of the dual damascene pattern, in a composite insulator layer. After formation of first metal structures, a first silicon nitride layer, a first silicon oxide layer, and a second silicon nitride layer, are deposited. Photolithographic and dry etching procedures, are used to pattern the second silicon nitride layer, creating a pattern of small area, silicon nitride islands, or shapes, with narrow spaces located between the small area, silicon nitride islands, overlying the first silicon oxide layer. After deposition of a second silicon oxide layer, a photoresist shape, with a wide diameter opening, and a first cycle, selective dry etch procedure, are used to define a wide diameter opening, in the second silicon oxide layer, exposing regions of first silicon oxide layer, located in the narrow spaces between the small area, silicon nitride islands, as well as exposing portions of the small area, silicon nitride islands. The first cycle, of the selective dry etch procedure is then continued, removing only the portion of first silicon oxide layer, exposed in the narrow space between the small area, silicon nitride islands, creating a narrow diameter opening, in the first silicon oxide layer, exposing a portion of the top surface of the first silicon nitride layer. A second dry etching cycle is then employed to selectively remove the portion of the first silicon nitride layer, exposed in the narrow diameter opening, exposing the top surface of the underlying first metal interconnect structure, as well as removing the portion of small area, silicon nitride islands, exposed in the wide diameter opening, in the second silicon oxide layer. A metal layer is then deposited completely filling the underlying, narrow diameter opening, in the first silicon oxide layer, as well completely filling the wide diameter opening, in the second silicon oxide layer. Removal of unwanted metal, from the top surface of the second silicon oxide layer, results in the dual damascene created metal structure, comprised of a second metal interconnect structure, in the wide diameter opening, overlying a metal via structure, located in the narrow diameter opening, contacting the underlying first metal interconnect structure.

BRIEF DESCRIPTION OF THE DRAWINGS

The object and other advantages of this invention are best described in the preferred embodiments with reference to the attached drawings that include:

FIGS. 1–3, (Prior Art), which schematically in cross-sectional style, describes the key stages of fabrication, used to create dual damascene formed, metal structures and vias, using a large area, silicon nitride layer, as a stop layer, during a dry etching procedure, used to create the wide and narrow diameter openings of the dual damascene pattern, in a composite insulator layer.

FIGS. 4–8, which schematically, in cross-sectional style, show the key stages of fabrication, used to create the dual damascene formed, metal structures and vias, featuring small area, silicon nitride islands, used as a stop layer, during the dry etching procedure used to create the wide and narrow diameter openings of the dual damascene pattern, in a composite insulator layer.

DESCRIPTION OF THE PREFERRED EMBODIMENTS

Figure 5:
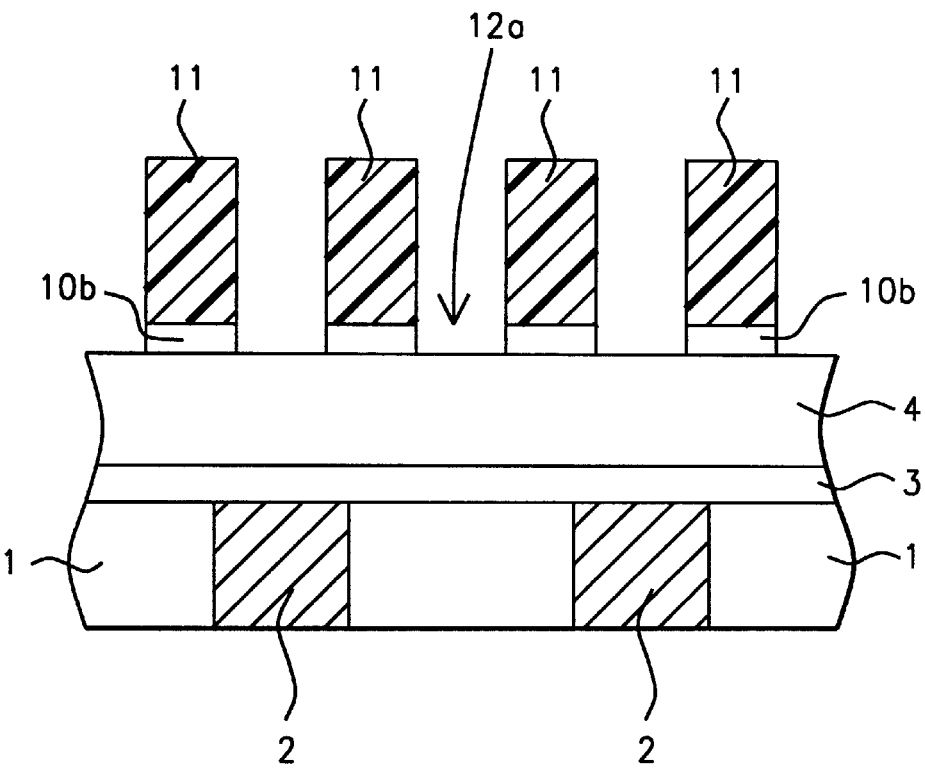

The method of fabricating metal interconnect, and metal via structures, using a dual damascene process, featuring the use of small area, silicon nitride islands, or shapes, used as an etch stop, during dry etching procedure used to create a dual damascene opening in a composite insulator layer, will now be described in detail. FIGS. 1–3, schematically, in cross-sectional style, describe a conventional method for forming metal interconnect, and metal vias, using a dual damascene process. Referring to FIG. 1, an insulator layer 1, comprised of a first silicon oxide layer, is shown. First silicon oxide layer 1, is subjected to a planarization procedure, using a chemical mechanical polishing, (CMP), procedure, to create a smooth top surface topography. After creating an opening in first silicon oxide layer 1, via conventional photolithographic and reactive ion etching, (RIE), procedures, a metal interconnect structure 2, such as copper, is formed in the opening in first silicon oxide layer 1 Prior to deposition of copper, via chemical vapor deposition, (CVD), or R.F. sputtering, a composite adhesive—barrier layer, comprised of titanium—titanium nitride, is used to coat the sides of the opening in silicon oxide layer 1. After deposition of the adhesive—barrier layer, and of copper, unwanted material is removed from the top surface of first silicon oxide layer 1, via CMP procedure, or via use of a selective RIE procedure, using a fluorine based gas, as an etchant.

After formation of metal interconnect structure 2, a first silicon nitride layer 3, is deposited using either a low pressure chemical vapor deposition, (LPCVD), or plasma enhanced chemical vapor deposition, (PECVD), procedure, at a thickness between about 50 to 300 Angstroms. First silicon nitride layer 3, is used as a barrier layer, preventing copper from interacting with subsequent overlying materials. Second silicon oxide layer 4, is next deposited, overlying first silicon nitride layer 3. Second silicon oxide layer 4, is obtained via LPCVD or PECVD procedures, at a thickness between about 4000 to 15000 Angstroms. A second silicon nitride layer 5, is then deposited, on second silicon oxide layer 4, again via LPCVD or PECVD procedures, to a thickness between about 200 to 2000 Angstroms. Conventional photolithographic and a selective RIE procedure, using a fluorine based gas, such as $CHF_3$, $CH_2F_2$, or $CH_3F$, as an etchant for second silicon nitride layer 5, are used to create narrow diameter opening 6a, in second silicon nitride layer 5, with narrow diameter opening 6a, aligning with underlying metal interconnect structure 2. This is schematically shown in FIG. 1. Narrow opening 6a, which will subsequently be used as a mask, to allow definition of the narrow diameter opening, of the dual damascene opening, is formed with a diameter between about 1500 to 5000 Angstroms. The photoresist shape, (not shown in the drawings), used for definition of narrow diameter opening 6a, in second silicon nitride layer 5, is removed via plasma oxygen ashing and careful wet cleans.

A third silicon oxide layer 7, is next deposited using LPCVD or PECVD procedures, at a thickness between about 3000 to 10000 Angstroms. Photoresist shape 8, with wide diameter opening 9a, shown schematically in FIG. 2, is next formed. Wide diameter opening 9a, with a diameter between about 1500 to 10000 Angstroms, directly aligns, or overlays, underlying narrow diameter opening 6a. A selective, first cycle, RIE procedure, using $CHF_3$ as an etchant for third silicon oxide layer 7, and for second silicon oxide layer 4, is next employed to create the dual damascene opening, comprised of wide diameter opening 9b, in third silicon oxide layer 7, and narrow diameter opening 6b, in second silicon oxide layer 4. Photoresist shape 8, served as the etch mask for definition of wide diameter opening 9b, while narrow diameter opening 6a, in second silicon nitride layer 5, served as the etch mask for definition of narrow diameter opening 6b. The selectivity of the first cycle RIE procedure, that is removing silicon oxide at a faster rate than the removal of silicon nitride, allowed the termination of the first cycle RIE procedure, to be accomplished at the appearance of first silicon nitride layer 3, located at the bottom of narrow diameter opening 6b. A second RIE cycle, using a fluorine based gas, such as $CHF_3$, $CH_2F_2$, or $CH_3F$, as an etchant, selectively removing silicon nitride at a faster rate than the removal of silicon oxide, is used to continue the opening of narrow diameter opening 6b, in first silicon nitride layer 3, exposing a portion of the top surface of metal interconnect structure 2. The second cycle RIE procedure, also removes the portion of second silicon nitride layer 5, that resided on second silicon oxide layer 4, exposed in the wide diameter opening 9b. This is schematically shown in FIG. 3. Removal of photoresist shape 8, is accomplished using plasma oxygen ashing and careful wet cleans.

The dual damascene opening, shown schematically in FIG. 3, can now be used to accept a metal structure, which would be comprised of a narrow diameter, metal via structure, located in narrow diameter opening 6b, and a metal interconnect structure, which would reside in wide diameter opening 9b. However the presence of second silicon nitride layer 5, as part of the composite insulator layer, adds significant capacitance, and this adversely influence device performance. Silicon nitride layer 5, with a dielectric constant of about 7, could not be thinned, to reduce capacitance, due to its use as a stop layer, during the dual damascene opening. In addition, the area of second silicon nitride layer 5, is approximately equal to the entire surface area of the semiconductor substrate, minus only the area of narrow diameter opening 6a. Therefore the thickness and level of surface area, of silicon nitride layer 5, significantly contribute to increased, and unwanted capacitance.

The process to create a dual damascene formed, metal structure, again using silicon nitride as an etch stop, for the selective RIE procedures, used to create the dual damascene opening, will now be described. However this procedure will describe a process in which only small area, silicon nitride islands, or shapes, are used as the etch stop layer, thus resulting in reduced insulator capacitance, when compared to counterparts fabricated using a large surface area, silicon nitride stop layer. FIG. 4, schematically shows metal interconnect structures 2, again comprised of copper, located in openings in first silicon oxide layer 1, with the openings again lined with a titanium—titanium nitride, adhesive—barrier layer. First silicon nitride layer 3, as well as second silicon oxide layer 4, are again obtained using identical procedures, and at identical thicknesses, previously described in FIGS. 1–3. Second silicon nitride layer 10a, is obtained via LPCVD or PECVD procedures, at a thickness between about 200 to 2000 Angstroms. This is schematically shown in FIG. 4.

Figure 6:
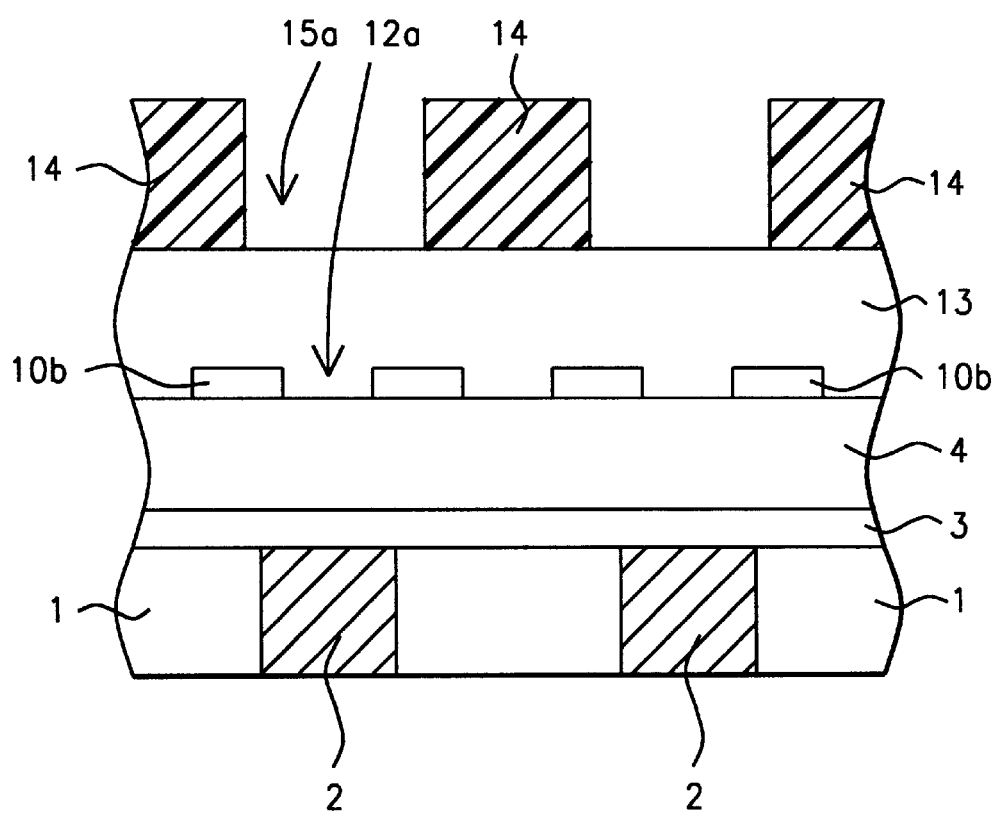

Photoresist shape 11, with opening 12a, is next formed, and used as a mask to allow a selective RIE procedure, using a fluorine based gas, such as $CHF_3$, $CH_2F_2$, or $CH_3F$, as an etchant, to pattern second silicon nitride layer 10a, creating small area, silicon nitride islands 10b, schematically shown in FIG. 5. The width of silicon islands 10b, is dependent on a topography ground rule. For example if the minimum space between two subsequent metal lines is to be about 0.18 um, with a minimum metal width of about 0.18 um, and if the via size is about 0.15 um, then the width of silicon islands 10b, will be between about 0.05 to 0.10 um. Opening 12a, or the space between silicon nitride islands, which will subsequently translate to the diameter of the narrow diameter opening, of the dual damascene opening, is at least 500 Angstroms. After removal of photoresist shape 11, via plasma oxygen ashing and careful wet cleans, third silicon oxide layer 13, shown schematically in FIG. 6, is deposited, via LPCVD or PECVD procedures, to a thickness between about 3000 to 15000 Angstroms. Photoresist shape 14, with opening 15a, is next formed on third silicon oxide layer 13. Opening 15a, between about 1500 to 10000 Angstroms in diameter, directly overlays opening, or narrow space 12a. Opening 15a, schematically shown in FIG. 6, will subsequently translate to the wide demeter opening of the dual diameter opening, in the composite insulator layer.

Figure 7:
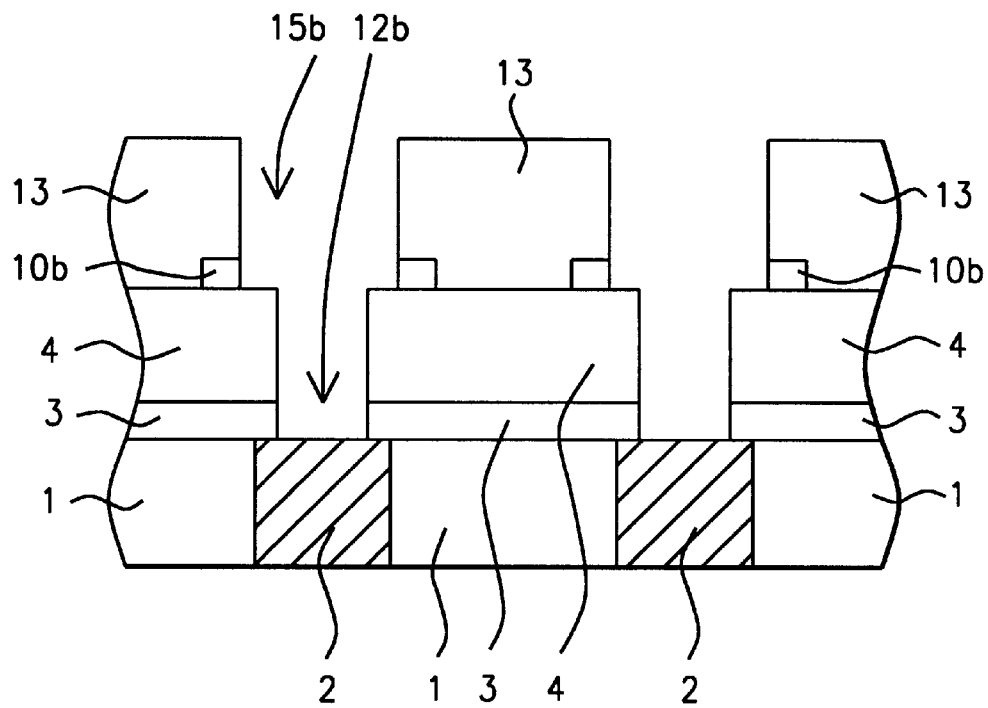

A two stage, selective RIE procedure, is again used to form the dual damascene opening in the composite insulator layer. A selective, first RIE cycle, using $CHF_3$ as an etchant, creates wide diameter opening 15b, in third silicon oxide layer 13, using opening 15a, in photoresist shape 14, as a mask, while creating narrow diameter opening 12b, in second silicon oxide layer 4, using opening 12a, located between small area, silicon nitride islands 10b, as a mask. This is accomplished via the selectivity of the first RIE procedure, using a fluorine based gas, such as $CHF_3$, $CH_2F_2$, or $CH_3F$, as an etchant, exhibiting a slow removal rate of silicon nitride, compared to the removal rate of silicon oxide, using this dry etchant. A selective, second RIE procedure, is next used to remove the portion of first silicon nitride layer 3, exposed in narrow diameter opening 12b, exposing a portion of the top surface of metal interconnect structure 2. The selective, second RIE procedure, also removes regions of small area, silicon nitride islands 10b, that were exposed in wide diameter opening 15b. This is schematically shown in FIG. 7. Removal of photoresist shape 14, is once again accomplished via plasma oxygen ashing and careful wet cleans.

Figure 8:
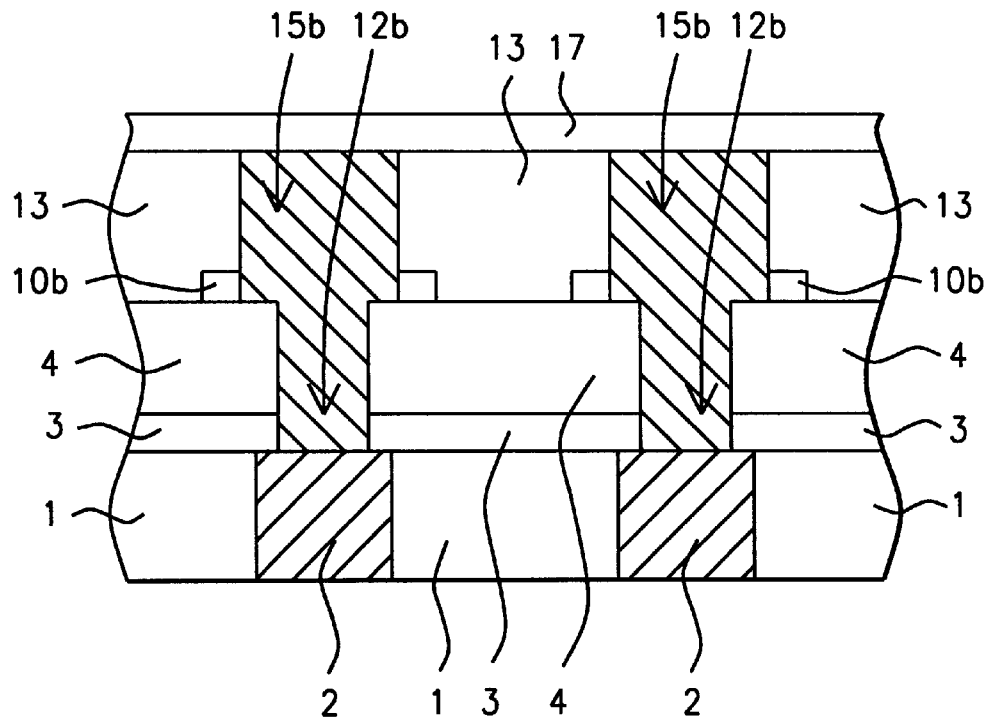

A dual damascene metal structure 16, is next formed, and shown schematically in FIG. 8. Dual damascene metal structure 16, can be comprised of copper, obtained via CVD or via R.F. sputtering procedures, at a thickness between 10000 to 30000 Angstroms, completely filling the dual damascene opening, comprised of wide diameter opening 15b, and narrow diameter opening 12b. Removal of unwanted copper, on the top surface of third silicon oxide layer 13, is removed via a CMP procedure. Prior to deposition of the copper layer, an adhesive—barrier layer, comprised of titanium—titanium nitride, is deposited, coating the sides of the dual damascene opening, and protecting the composite insulator layer from copper reaction. Dual damascene metal structure 16, is comprised of a copper metal via structure, residing in narrow diameter opening 12b, and a copper interconnect structure, residing in wide diameter opening 15b. A third silicon nitride layer 17, is shown schematically in FIG. 8, obtained via PECVD or LPCVD procedures, at a thickness between about 50 to 300 Angstroms, and used as a barrier layer to prevent copper from reacting with subsequent overlying materials.

The creation of the dual damascene metal structure, using small area, silicon nitride islands, or shapes 10b, as a etch stop layer, and as a component of the composite insulator layer, offers less capacitance than counterparts fabricated using larger area, silicon nitride stop layers, used as a component of the composite insulator layer.

While this invention has been particularly shown and described with reference to the preferred embodiments thereof, it will be understood by those skilled in the art that various changes in form details may be made without departing from the spirit and scope of this invention.

What is claimed is:

1. A method of fabricating a metal structure, on a semiconductor substrate, with the metal structure featuring a wide, metal shape, on underlying, narrow metal shape, comprising the steps of:

providing a first metal interconnect structure, located in an opening in a first insulator layer;

depositing a first silicon nitride layer, a second insulator layer, and a second silicon nitride layer, on the top surface of said first metal interconnect structure, and on the top surface of said first insulator layer;

patterning of said second silicon nitride layer, to form silicon nitride islands, with narrow spaces between said silicon nitride islands, exposing a portion of the top surface of underlying, said second insulator layer;

depositing a third insulator layer;

forming a photoresist shape, on said third insulator layer, featuring a wide opening in said photoresist shape, exposing a portion of the top surface of said third insulator layer;

performing a selective, first dry etching procedure, using said wide opening, in said photoresist shape as a mask, to create a wide diameter opening, in said third insulator layer, exposing a portion of said silicon nitride islands, and exposing a narrow space, located between said silicon nitride islands, then continuing said selective, first dry etching procedure, to create a narrow diameter opening in said second insulator layer, using portions of said silicon nitride islands, exposed in said wide diameter opening, as a mask, to create a narrow diameter opening in said second insulator layer, exposing a portion of said first silicon nitride layer, located at the bottom of said narrow diameter opening;

performing a selective, second dry etching procedure, to remove portion of said first silicon nitride layer, located at the bottom of said narrow diameter opening, exposing a portion of the top surface of said first metal interconnect structure, and removing portions of said silicon nitride islands, exposed in said wide diameter opening; and forming said metal structure, comprised of said wide metal shape, located in said wide diameter opening, and comprised of said narrow metal, located in said narrow diameter opening, with said narrow metal shape, overlying and contacting, the portion of said first metal interconnect structure, exposed at the bottom of said narrow diameter opening.

2. The method of claim 1, wherein said first silicon nitride layer is obtained via LPCVD or PECVD procedures, at a thickness between about 50 to 300 Angstroms.

3. The method of claim 1, wherein said second insulator layer is silicon oxide, obtained via LPCVD or PECVD procedures, at a thickness between about 4000 to 15000 Angstroms.

4. The method of claim 1, wherein said second silicon nitride layer is obtained via LPCVD or PECVD procedures, at a thickness between about 200 to 2000 Angstroms.

5. The method of claim 1, wherein said silicon nitride islands are formed via an anisotropic RIE procedure, performed to said second silicon nitride layer, using a fluorine based gas, such as $CHF_3$, $CH_2F_2$, or $CH_3F$, as an etchant, with a space between said silicon nitride islands, of at least 500 Angstroms.

6. The method of claim 1, wherein said third insulator layer is silicon oxide, obtained via LPCVD or PECVD procedures, at a thickness between about 3000 to 15000 Angstroms.

7. The method of claim 1, wherein said selective, first dry etching procedure, used to create said wide diameter opening, in said third insulator layer, and to create said narrow diameter opening, in said second insulator layer, is an anisotropic RIE procedure, using $CHF_3$ as an etchant.

8. The method of claim 1, wherein the diameter of said wide diameter opening, in said third insulator layer, is between about 1500 to 10000 Angstroms.

9. The method of claim 1, wherein the diameter of said narrow diameter opening, in said second insulator layer, is between about 1500 to 5000 Angstroms.

10. The method of claim 1, wherein said selective, second dry etching procedure, used to remove the portion of said first silicon nitride layer, exposed in said narrow diameter opening, and to remove the portions of said silicon nitride islands, exposed in said wide diameter opening, is an anisotropic RIE procedure, using a fluorine based gas, such as $CHF_3$, $CH_2F_2$, or $CH_3F$, as an etchant.

11. The method of claim 1, wherein said metal structure, formed in said wide diameter opening, and in said narrow diameter opening, is comprised of copper.

12. A method of forming a metal structure, on a semiconductor substrate, comprised of a wide metal shape, on an underlying narrow metal shape, using a dual damascene process, and using silicon nitride islands as an etch stop, during the patterning of a dual damascene opening, in a composite insulator layer, comprising the steps of:

providing a first silicon oxide layer, with an opening in said first silicon oxide layer;

forming a first metal interconnect structure, in said opening in said first silicon oxide layer;

depositing a first silicon nitride layer;

depositing a second silicon oxide layer;

depositing a second silicon nitride layer;

patterning of said second silicon nitride layer, to create said silicon nitride islands, on said second silicon oxide layer, and creating a narrow space between said silicon nitride islands, exposing a portion of the top surface of said second silicon oxide layer;

depositing a third silicon oxide layer;

forming a photoresist shape, with a wide diameter opening in said photoresist shape, exposing a portion of the top surface of said third silicon oxide layer;

performing a selective, first RIE procedure, using said wide diameter opening, in said photoresist shape, as a mask, to create a wide diameter opening, in said third silicon oxide layer, than using portions of said silicon nitride islands, exposed in said wide diameter opening, in said third silicon oxide layer, as a mask, to create a narrow diameter opening, in said second silicon oxide layer, exposing a portion of said first silicon nitride layer, located at the bottom of said narrow diameter opening;

performing a selective, second RIE procedure, removing said portions of said silicon nitride islands, exposed in said wide diameter opening, in said third silicon oxide layer, and removing said portion of said first silicon nitride layer, exposed at the bottom of said narrow diameter opening, exposing a portion of the top surface of said first metal interconnect structure;

depositing a metal layer; and removing portions of metal layer from the top surface of said third silicon oxide layer, forming said metal structure in said dual damascene opening, with said metal structure comprised of a wide metal shape, located in said wide diameter opening, and comprised of a narrow metal shape, located in said narrow diameter opening.

13. The method of claim 12, wherein said first metal interconnect structure is comprised of a titanium titanium—nitride, adhesive—barrier layer, on the sides of said opening in said first silicon oxide layer, and filled with copper.

14. The method of claim 12, wherein said first silicon nitride layer is obtained via LPCVD or PECVD procedures, at a thickness between about 50 to 300 Angstroms.

15. The method of claim 12, wherein said second silicon oxide layer is obtained via LPCVD or PECVD procedures, at a thickness between about 4000 to 15000 Angstroms.

16. The method of claim 12, wherein said second silicon nitride layer is obtained via LPCVD or PECVD procedures. at a thickness between about 200 to 2000 Angstroms.

17. The method of claim 12, wherein said silicon nitride islands are formed via an anisotropic RIE procedure, applied to said second silicon nitride layer, using a fluorine based gas, such as $CH_3F$, $CHF_3$, or $CH_2F_2$, as an etchant.

18. The method of claim 12, wherein said narrow space, between said silicon nitride islands, is at least 500 Angstroms.

19. The method of claim 12, wherein said third silicon oxide layer is obtained via LPCVD or PECVD procedures, at a thickness between about 3000 to 15000 Angstroms.

20. The method of claim 12, wherein said selective, first RIE procedure, used to create said wide diameter opening, in said third silicon oxide layer, and to create said narrow diameter opening, in said second silicon oxide layer, is performed using $CHF_3$ as an etchant.

21. The method of claim 12, wherein the diameter of said wide diameter opening, in said third silicon oxide layer, is between about 1500 to 10000 Angstroms.

22. The method of claim 12, wherein the diameter of said narrow diameter opening, in said second silicon oxide layer, is between about 1500 to 5000 Angstroms.

23. The method of claim 12, wherein said selective, second RIE procedure, used to remove said portion of said silicon nitride, exposed in said wide diameter opening, and used to remove the portion of said first silicon nitride layer, exposed at the bottom of said narrow diameter opening, is performed using a fluorine based such as $CHF_3$, $CH_2F_2$, or $CH_3F$, as an etchant.

24. The method of claim 12, wherein said metal structure, formed in said dual damascene opening, is comprised of a titanium -titanium nitride, adhesive—barrier layer, on the sides of said dual damascene opening, and comprised of a copper layer, located inside the dual damascene opening.

* * * * *